(12) United States Patent
Nishida

(10) Patent No.: US 7,466,733 B2
(45) Date of Patent: Dec. 16, 2008

(54) OPTICAL DEVICE CHIP, AND OPTICAL MODULE AND METHOD FOR MANUFACTURING THE SAME

(75) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/738,742

(22) Filed: Apr. 23, 2007

(65) Prior Publication Data
US 2007/0273990 A1   Nov. 29, 2007

(30) Foreign Application Priority Data
May 23, 2006   (JP)   ............... 2006-142302

(51) Int. Cl.
*H01S 3/00*   (2006.01)
(52) U.S. Cl. .............. 372/38.05; 372/43.01; 372/87
(58) Field of Classification Search ............. 372/38.05, 372/87
See application file for complete search history.

(56) References Cited

U.S. PATENT DOCUMENTS

| 6,310,669 | B1 | 10/2001 | Kobayashi et al. |
| 6,650,378 | B2 | 11/2003 | Kobayashi et al. |
| 7,339,970 | B2 * | 3/2008 | Kaneko .................... 372/50.21 |
| 2006/0017061 | A1 * | 1/2006 | Sakamoto et al. ........... 257/103 |
| 2008/0031295 | A1 | 2/2008 | Tanaka |

FOREIGN PATENT DOCUMENTS

| JP | 06-232440 | 8/1994 |
| JP | 08-008487 | 1/1996 |
| JP | 11-242241 | 9/1999 |
| JP | 2004-006548 | 1/2004 |
| JP | 2005-33106 | 2/2005 |
| JP | 2005-136177 | 5/2005 |
| JP | 2005-303080 | 10/2005 |

* cited by examiner

*Primary Examiner*—Dung T Nguyen
(74) *Attorney, Agent, or Firm*—Harness, Dickey & Pierce, P.L.C.

(57) ABSTRACT

An optical device chip includes: a first semiconductor layer of a first conductivity type; an optical layer that emits light or receives light formed above the first semiconductor layer; a second semiconductor layer of a second conductivity type formed above the optical layer; a first electrode electrically connected to the first semiconductor layer; a second electrode electrically connected to the second semiconductor layer; and a connecting section that short-circuits the first electrode and the second electrode.

1 Claim, 6 Drawing Sheets

OPTICAL DEVICE CHIP, AND OPTICAL MODULE AND METHOD FOR MANUFACTURING THE SAME

The entire disclosure of Japanese Patent Application No. 2006-142302, filed May 23, 2006 is expressly incorporated by reference herein.

BACKGROUND

1. Technical Field

The present invention relates to optical device chips, and optical modules and methods for manufacturing the same.

2. Related Art

An optical device such as a surface-emitting type semiconductor laser itself has a low electrostatic breakdown voltage, such that the device may be damaged by static electricity caused by a machine or an operator in a mounting process. A variety of measures are usually implemented in a mounting process to remove static electricity, but these measures have limitations.

For example, Japanese laid-open patent application JP-A-2004-6548 describes a technology to compose a capacitance device by laminating insulating films and metal films wherein the capacitance device serves as a breakdown voltage device. In this case, it may take a long time for laminating layers to form a desired capacitance device as the insulating films and metal films are laminated.

SUMMARY

In accordance with an advantage of some aspects of the invention, electrostatic destruction can be prevented and reliability can be improved in optical device chips, and optical modules and methods for manufacturing the same.

In accordance with an embodiment of the invention, an optical device chip includes: a first semiconductor layer of a first conductivity type; an optical layer that emits light or receives light formed above the first semiconductor layer; a second semiconductor layer of a second conductivity type formed above the optical layer; a first electrode electrically connected to the first semiconductor layer; a second electrode electrically connected to the second semiconductor layer; and a connecting section that short-circuits the first electrode and the second electrode.

When a voltage that may cause electrostatic breakdown at the optical section (to be described below) in the optical device chip, a current flows to the connecting section that short-circuits the both ends of the optical section. By this, electrostatic breakdown of the optical section can be prevented in a mounting process, such that, by the optical device chip described above, its reliability can be improved.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case of "B" formed directly on "A," and a case of "B" formed over "A" through another member on "A."

The optical device chip in accordance with an aspect of the embodiment may be a surface-emitting type semiconductor laser chip, wherein the first semiconductor layer and the second semiconductor layer may be distributed Bragg reflection type mirrors, and the optical layer may be an active layer.

The optical device chip in accordance with an aspect of the embodiment may be a photodiode chip, wherein the optical layer may be a light absorbing layer.

It is noted that, in the invention, the "light absorbing layer" conceptually includes a depletion layer.

In the optical device chip in accordance with an aspect of the embodiment, the connecting section may be composed of a material different from that of the first electrode and the second electrode.

In the optical device chip in accordance with an aspect of the embodiment, the connecting section may be formed in a shortest route between a pad section of the first electrode and a pad section of the second electrode.

A method for manufacturing an optical module in accordance with an embodiment of the invention includes the steps of: forming an optical device chip, which includes the steps of forming a first conductive layer of a first conductivity type above a substrate, forming an optical layer that emits light or receives light above the first semiconductor layer, forming a second semiconductor layer of a second conductivity type above the optical layer, forming a first electrode that is electrically connected to the first semiconductor layer, forming a second electrode that is electrically connected to the second semiconductor layer, and forming a connecting section that short-circuits the first electrode and the second electrode; mounting the optical device chip on a supporting member; and cutting the connecting section.

In the method for manufacturing an optical module in accordance with the present embodiment, the connecting section may be cut by laser.

In the method for manufacturing an optical module in accordance with the present embodiment, the connecting section may be cut by applying a voltage.

In the method for manufacturing an optical module in accordance with the present embodiment, the connecting section may be cut by etching.

An optical module in accordance with an embodiment of the invention includes: a supporting member; and an optical device chip mounted above the supporting member, wherein the optical device chip includes: a first semiconductor layer of a first conductivity type; an optical layer that emits light or receives light formed above the first semiconductor layer; a second semiconductor layer of a second conductivity type formed above the optical layer; a first electrode electrically connected to the first semiconductor layer; a second electrode electrically connected to the second semiconductor layer; a first conductive section protruding from a pad section of the first electrode; and a second conductive section protruding from a pad section of the second electrode, wherein the first conductive section and the second conductive section are composed of a material different from that of the first electrode and the second electrode, the first conductive section may protrude toward the second conductive section, and the second conductive section may protrude toward the first conductive section.

DESCRIPTION OF EXEMPLARY EMBODIMENTS

Preferred embodiments of the invention are described below with reference to the accompanying drawings.

1. First, an optical device chip 100 in accordance with an embodiment of the invention is described.

Figure 1:
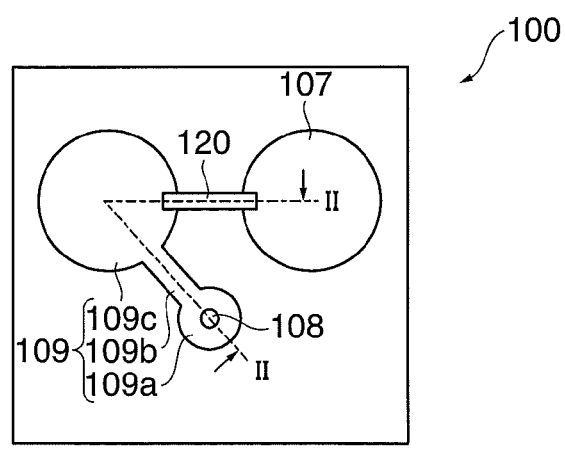
FIG. 1 schematically shows a plan view of an optical device chip in accordance with an embodiment of the invention.
Figure 2:
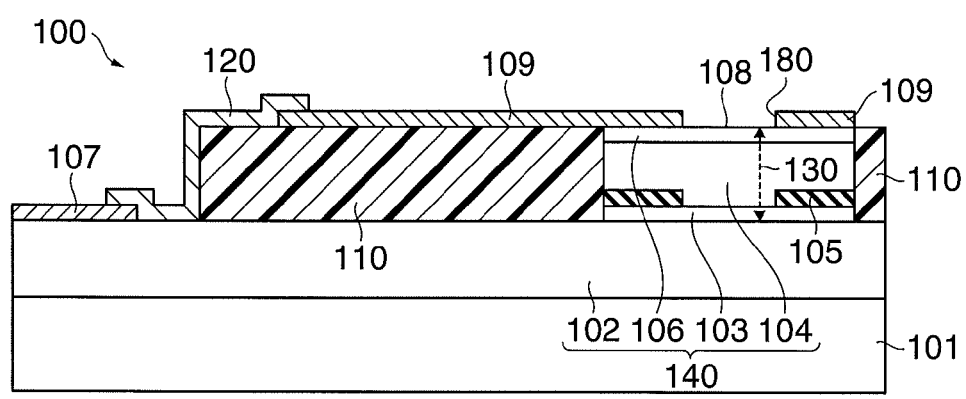
FIG. 2 schematically shows a cross-sectional view of the optical device chip in accordance with the embodiment.
Figure 3:
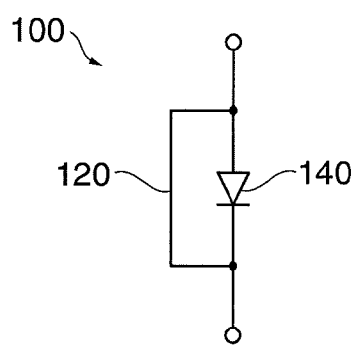
FIG. 3 is a circuit diagram of the optical device chip in accordance with the present embodiment.

FIG. 1 schematically shows a plan view of the optical device chip 100 in accordance with the present embodiment, FIG. 2 is a cross-sectional view taken along lines II-II of FIG. 1, and FIG. 3 is a circuit diagram of the optical device chip 100. In the present embodiment, an example in which the optical device chip 100 is a surface-emitting type semiconductor laser chip is described.

The optical device chip 100 may include, as shown in FIG. 1 and FIG. 2, a substrate 101, an optical section (a light emitting section) 140, a dielectric layer 110, a first electrode 107, a second electrode 109, and a connecting section 120.

As the substrate 101, for example, a GaAs substrate of a first conductivity type (for example, n-type) may be used. The optical section 140 is formed on the substrate 101. The optical section 140 may include a first semiconductor layer 102 of the first conductivity type (n-type), an optical layer 103 that is formed on the first semiconductor layer 102 and emits light, a second semiconductor layer 104 of a second conductivity type (for example, p-type) that is formed on the optical layer 103, and a contact layer 106 that is formed on the second semiconductor layer 104. More concretely, the first semiconductor layer 102 is, for example, a distributed Bragg reflection type (DBR) mirror of 40 pairs of alternately laminated n-type $Al_{0.9}Ga_{0.1}As$ layers and n-type $Al_{0.15}Ga_{0.85}As$ layers. The optical layer 103 is an active layer that has a multiple quantum well (MQW) structure in which quantum well structures each formed from, for example, a GaAs well layer and an $Al_{0.3}Ga_{0.7}As$ barrier layer are laminated in three layers. The second semiconductor layer 104 is, for example, a DBR mirror of 25 pairs of alternately laminated p-type $Al_{0.9}Ga_{0.1}As$ layers and p-type $Al_{0.15}Ga_{0.85}As$ layers. The first semiconductor layer 102, the optical layer 103 and the second semiconductor layer 104 can form a resonator. It is noted that the composition of each of the layers and the number of the layers composing the first semiconductor layer 102, the optical layer 103 and the second semiconductor layer 104 are not particularly limited. The p-type second semiconductor layer 104, the optical layer 103 that is not doped with an impurity and the n-type first semiconductor layer 102 form a pin diode.

The contact layer 106 is, for example, a GaAs layer of the second conductivity type (p-type). For example, the contact layer 106, the second semiconductor layer 104 and the optical layer 103 can form a columnar semiconductor laminate (hereafter referred to as a "columnar section") 130. The columnar section 130 has a plane configuration that is, for example, circular.

Also, as shown in FIG. 2, for example, at least one of the layers composing the second semiconductor layer 104 can be formed as an oxidized constricting layer 105. The oxidized constricting layer 105 is formed in a region near the optical layer 103. As the oxidized constricting layer 105, for example, an oxidized AlGaAs layer can be used. The oxidized constricting layer 105 is a dielectric layer having an opening section. The oxidized constricting layer 105 is formed in a ring shape.

The first electrode 107 is formed on a top surface of the first semiconductor layer 102. The first electrode 107 is electrically connected to the first semiconductor layer 102. The first electrode 107 serves as an electrode pad that is connected to an external wiring or the like. The first electrode 107 has a plane configuration that is, for example, a circular shape shown in FIG. 1.

The second electrode 109 is formed on the contact layer 106 and the dielectric layer 110. The second electrode 109 is electrically connected to the second semiconductor layer 104 through the contact layer 106. The second electrode 109 may include, as shown in FIG. 1, a contact section 109a, a lead-out section 109b and a pad section 109c. The second electrode 109 is in contact with the contact layer 106 at the contact section 109a. The contact section 109a of the second electrode 109 has a plane configuration that is, for example, a ring shape shown in FIG. 1. The contact section 109a has an opening section 180 over the columnar section 130. The opening section 180 defines a region where the contact section 109a is not provided on the upper surface of the contact layer 106. This region defines an emission surface 108 for emission of laser light. The emission surface 108 has a configuration that is, for example, a circular shape shown in FIG. 1. The lead-out section 109b of the second electrode 109 connects the contact section 109a and the pad section 109c. The lead-out section 109b has, for example, a linear plane configuration shown in FIG. 1. The pad section 109c of the second electrode 109 serves as an electrode pad to be connected to an external wiring or the like. The pad section 109c has a plane configuration that is, for example, a circular shape shown in FIG. 1.

The dielectric layer 110 is formed on the first semiconductor layer 102. The dielectric layer 110 is formed in a manner to surround the columnar section 130. The lead-out section 109b and the pad section 109c of the second electrode 109 are formed on the dielectric layer 110. The dielectric layer 110 electrically isolates the second electrode 109 from the first semiconductor layer 102.

The connecting section 120 short-circuits the first electrode 107 and the second electrode 109. In other words, the connecting section 120 short-circuits both ends of the optical section 140, as shown in a circuit diagram in FIG. 3. The connecting section 120 is formed on the first semiconductor layer 102 and the dielectric layer 110, and connects the first electrode 107 and the pad section 109c of the second electrode 109. The connecting section 120 may be formed extending over the first electrode 107 and the second electrode 109, for example, as shown in FIG. 2. The connecting section 120 has a plane configuration that is, for example, a single linear line shape, as shown in FIG. 1. The connecting section 120 may be formed in the shortest route between the pad section of the first electrode 107 and the pad section 109c of the second electrode 109. By this, the first electrode 107 and the second electrode 109 can be short-circuited by the connecting section 120 with a necessity minimum distance. The plane configuration of the connecting section 120 may be formed from, for example, a plurality of linear lines. The plane configuration of the connecting section 120 may be, for example, a single curved line or a plurality of curved lines without any particular limitation. The material, length, width and thickness of the connecting section 120 may be appropriately selected such that the connecting section 120 can be readily cut in the step of cutting the connecting section 120 to be described below.

2. Next, an example of a method for manufacturing an optical device chip 100 in accordance with an embodiment of the invention is described with reference to the accompanying drawings.

Figure 4:
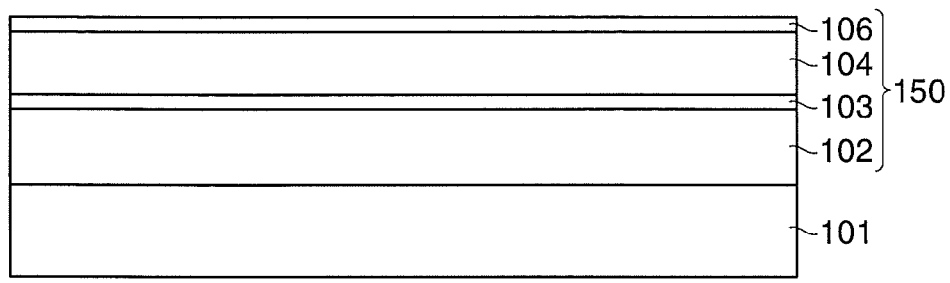
FIG. 4 is a schematic cross-sectional view showing a manufacturing step of manufacturing an optical device chip in accordance with an embodiment of the invention.
Figure 5:
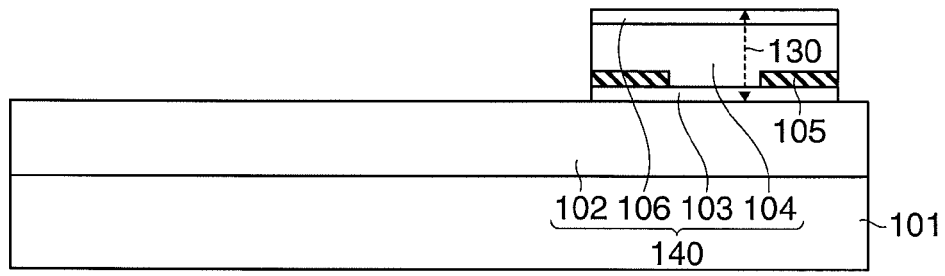
FIG. 5 is a schematic cross-sectional view showing a manufacturing step of manufacturing the optical device chip in accordance with the embodiment.
Figure 6:
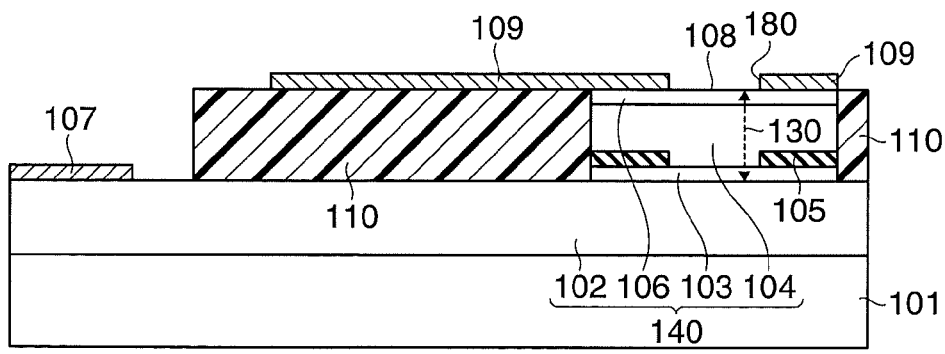
FIG. 6 is a schematic cross-sectional view showing a manufacturing step of manufacturing the optical device chip in accordance with the embodiment.
Figure 7:
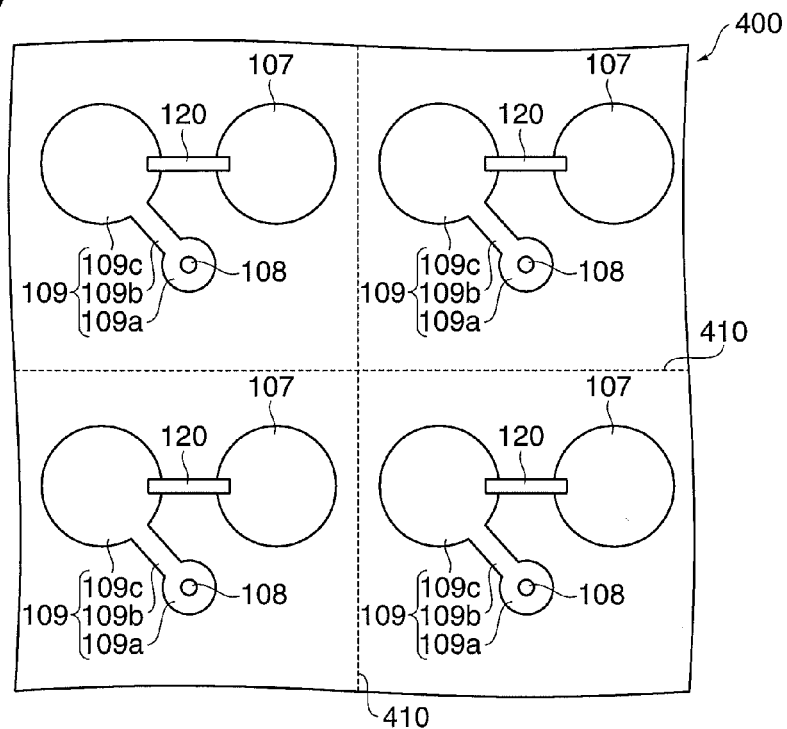
FIG. 7 is a schematic plan view showing a manufacturing step of manufacturing an optical device chip in accordance with the embodiment.

FIG. 4 through FIG. 6 are cross-sectional views schematically showing a process for manufacturing the optical device chip 100 in accordance with the present embodiment shown in FIG. 1 and FIG. 2, and correspond to the cross-sectional view shown in FIG. 2, respectively. Also, FIG. 7 is a plan view schematically showing a manufacturing step of manufacturing the optical device chip 100. In the present embodiment, an example in which the optical device chip 100 is a surface-emitting type semiconductor laser chip is described.

(1) First, as shown in FIG. 4, for example, an n-type GaAs substrate is prepared as a substrate 101. Next, a semiconductor multilayer film 150 is formed on the substrate 101 by epitaxial growth while modifying its composition. The semiconductor multilayer film 150 is composed of successively laminated semiconductor layers that compose a first semiconductor layer 102, an optical layer 103, a second semiconductor layer 104, and a contact layer 106. It is noted that, when the second semiconductor layer 104 is grown, at least one layer thereof near the optical layer 103 may be formed to be a layer that is later oxidized and becomes an oxidized constricting layer 105. As the layer that becomes to be the oxidized constricting layer 105, for example, an AlGaAs layer with its Al composition being 0.95 or greater can be used.

(2) Next, as shown in FIG. 5, the semiconductor multilayer film 150 is patterned to form the first semiconductor layer 102, the optical layer 103, the second semiconductor layer 104 and the contact layer 106 in a desired configuration. As a result, a columnar section 130 is formed. The semiconductor multilayer film 150 can be patterned by, for example, lithography technique and etching technique.

Then, by placing the substrate 101 on which the columnar section 130 is formed through the aforementioned steps in a water vapor atmosphere at about 400° C., for example, the layer that becomes to be an oxidized constricting layer 105 is oxidized from its side surface, thereby forming the oxidized constricting layer 105.

(3) Next, as shown in FIG. 6, a dielectric layer 110 is formed on the first semiconductor layer 102 in a manner to surround the columnar section 130. First, a dielectric layer composed of polyimide resin is formed over the entire surface by using, for example, a spin coat method. Then, the top surface of the columnar section 130 is exposed by using, for example, a CMP method. Then, the dielectric layer is patterned by using, for example, lithography technique and etching technique. In this manner, the dielectric layer 110 in a desired configuration can be formed.

Then, first and second electrodes 107 and 109 are formed. These electrodes can be formed in a desired configuration by, for example, a vacuum vapor deposition method and a lift-off method combined. It is noted that the order to form the electrodes is not particularly limited.

(4) Next, as shown in FIG. 7, a connecting section 120 is formed in a manner to short-circuit the first electrode 107 and the second electrode 109. The connecting section 120 can be formed in a desired configuration by, for example, a vacuum vapor deposition method and a lift-off method combined. It is noted that, if the connecting section 120 is formed with the same material as that of at least one of the first electrode 107 and the second electrode 109, they can be formed by the same manufacturing process.

(5) By the steps described above, an optical device wafer 400 in accordance with an embodiment of the invention is obtained, as shown in FIG. 7. It is noted that FIG. 7 shows a portion (a portion that becomes four optical device chips) of the optical device wafer 400 for the sake of convenience.

(6) Then, a dicing step is conducted to cut the optical device wafer 400 along scribe lines 410.

(7) By the steps described above, the optical device chip 100 in accordance with the present embodiment as shown in FIGS. 1 and 3 is obtained.

3. Next, modified examples of optical device chips in accordance with embodiments of the invention are described. It is noted that features different from those of the optical device chip 100 (hereafter called the "example of the optical device chip 100") shown in FIGS. 1 and 2 are described, and description of the same features shall be omitted.

The example of the optical device chip 100 is described as to the case where the optical device chip 100 is a surface-emitting type semiconductor laser chip. However, the invention is also applicable to other light emitting device chips (such as, for example, LED chips, organic LED chips, and edge-emitting type semiconductor laser chips).

Also, the invention is applicable to photodetector device chips (such as, for example, pin type photodiode (PD) chips, pn type PD chips, avalanche type PD chips, and MSM type PD chips). For example, FIG. 8 is a cross-sectional view schematically showing an example in which an optical device chip 200 is a pin type PD chip.

Figure 8:
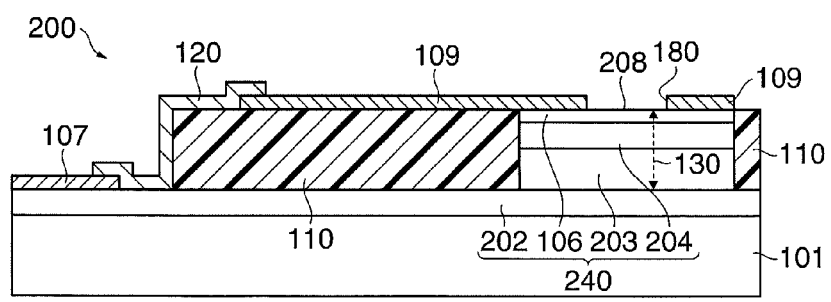
FIG. 8 schematically shows a cross-sectional view of an optical device chip in accordance with a modified example of the present embodiment.

The optical device chip 200 can have an optical section (light receiving section) 240, instead of the optical section 140 of the example of the optical device chip 100, as shown in FIG. FIG. 8. The optical section 240 may include a first conductive layer 202 of a first conductivity type (for example, n-type), an optical layer 203 formed on the first semiconductor layer 202, a second semiconductor layer 204 of a second conductivity type (for example, p-type) formed on the optical layer 203, and a contact layer 106 formed on the second semiconductor layer 204. Concretely, the first semiconductor layer 202 is composed of, for example, an n-type GaAs layer. The optical layer 203 is a photoabsorption layer composed of a GaAs layer in which no impurity is doped. The second semiconductor layer 204 is composed of, for example, a p-type GaAs layer. The first semiconductor layer 202, the optical layer 203 and the second semiconductor layer 204 can function as a pin type PD. In the optical device chip 200, a light incidence surface 208 is formed, instead of the light emission surface 108 of the example of the optical device chip 100.

Also, the invention is applicable to, for example, an optical device chip in which the optical section (light emitting section) 140 and the optical section (light receiving section) 240 are laminated (for example, a surface-emitting type semiconductor laser chip with a monitor PD).

It is noted that the modified example described above is only an example, and the invention is not limited to the modified example.

4. Next, a manufacturing method for manufacturing an optical module, and an optical module 700 that is obtained by the manufacturing method are described.

Figure 9:
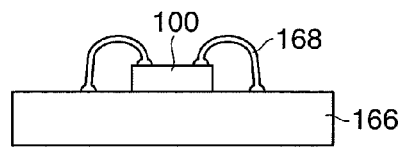
FIG. 9 is a schematic cross-sectional view showing a manufacturing step of manufacturing an optical module in accordance with an embodiment of the invention.
Figure 10:
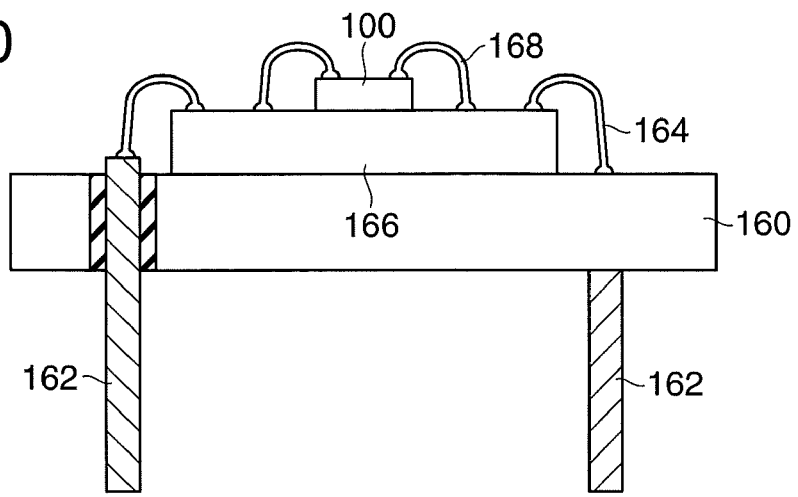
FIG. 10 is a schematic cross-sectional view showing a manufacturing step of manufacturing the optical module in accordance with the embodiment.
Figure 11:
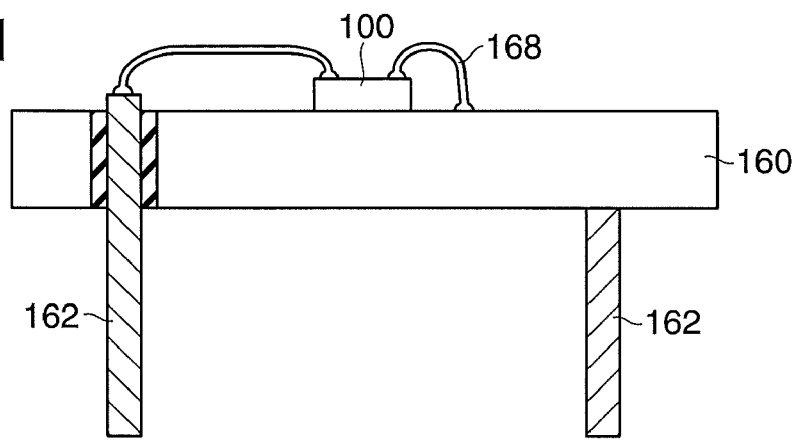
FIG. 11 is a schematic cross-sectional view showing a manufacturing step of manufacturing the optical module in accordance with the embodiment.
Figure 12:
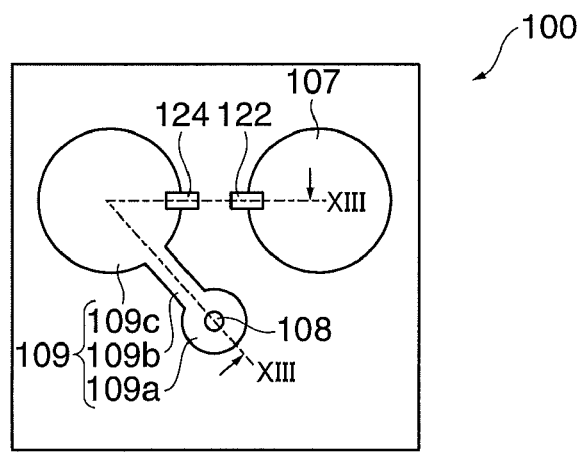
FIG. 12 is a schematic plan view showing a manufacturing step of manufacturing an optical module in a main portion in accordance with an embodiment of the invention.
Figure 13:
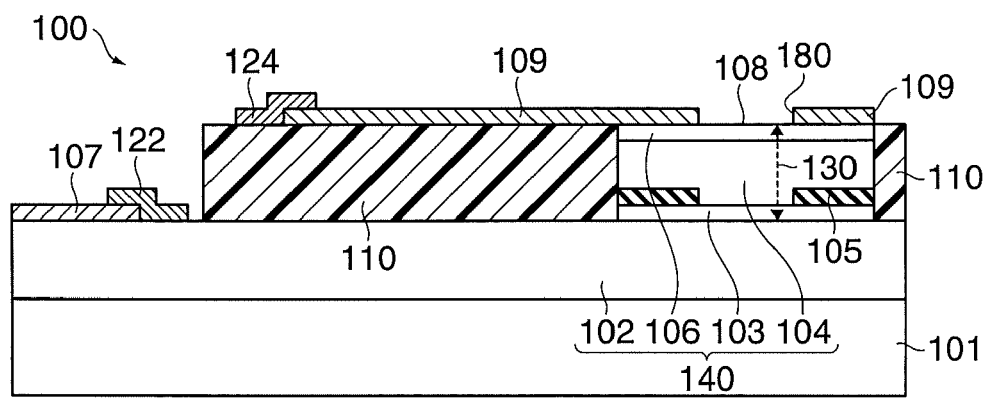
FIG. 13 is a schematic cross-sectional view showing a manufacturing step of manufacturing the optical module in the main portion in accordance with the embodiment.
Figure 14:
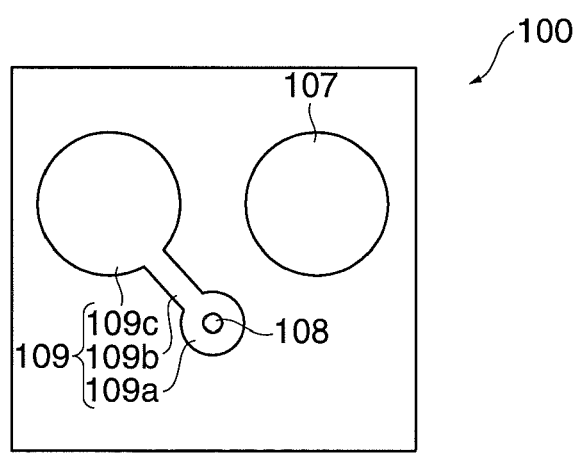
FIG. 14 is a schematic plan view showing a manufacturing step of manufacturing the optical module in the main portion in accordance with the embodiment.

FIGS. 9-11 are cross-sectional views schematically showing a process for manufacturing the optical module 700. FIG. 12 and FIG. 14 are plan views schematically showing manufacturing steps for manufacturing the optical module 700 in a main portion, and FIG. 13 is a cross-sectional view taken along lines XIII-XIII in FIG. 12. It is noted that the optical module 700 has an optical device chip 100 described above with reference to FIGS. 1 and 2.

(1) First, as shown in FIG. 9, a first die bonding step is conducted in which the optical device chip 100 described above is fixedly bonded onto a supporting member (hereafter referred to as a "first supporting member") 166. The first supporting member 166 may also be called a sub-mount. As the first supporting member 166, for example, a ceramics member with leads composed of metal film formed on its top surface may be used.

As shown in FIG. 9, a first wire bonding step is conducted in which electrode pads of the optical device chip 100 and leads of the first supporting member 166 are connected by bonding wires 168.

(2) Next, as shown in FIG. 10, a second die bonding step is conducted in which the first supporting member 166 with the optical device chip 100 mounted thereon is fixedly bonded onto another supporting member (hereafter referred to as a "second supporting member"). It is noted that the second supporting member 160 may also be called a stem. As the second supporting member 160, for example, a metal member may be used. The second supporting member 160 is provided with lead pins 162 for transmission and reception of electrical signals with an external device.

Next, as shown in FIG. 10, a second wire bonding step is conducted in which leads of the first supporting member 166 are connected with the second supporting member 160 and the lead pins 162 by bonding wires 164.

By the steps described above, the optical device chip 100 can be mounted above the second supporting member 160 through the first supporting member 166. It is noted that, as shown in FIG. 11, the optical device chip 100 may be directly mounted on the second supporting member 160 without the first supporting member 166 being intervened.

(4) Next, as shown in FIGS. 12 through FIG. 14, the connecting sections 120 provided on the optical device chip 200 are cut. It is noted that FIGS. 12 through 14 schematically show the optical device chip 100 upon completion of the process.

The connecting section 120 may be cut by, for example, laser. For example, laser is irradiated to a portion of the connecting section 120, whereby the portion of the connecting section 120 can be fused. By this, the connecting section 120 of the optical device chip 100 is divided into a first conductive section 122 and a second conductive section 124, as shown in FIG. 12 and FIG. 13. In other words, the first conductive section 122 and the second conductive section 124 are not continuous with each other. The first conductive section 122 protrudes from the pad section of the first electrode 107 toward the pad section 109c of the second electrode 109. Similarly, the second conductive section 124 protrudes from the pad section 109c of the second electrode 109 toward the pad section of the first electrode 107. In the illustrated example, the first conductive section 122 protrudes from the pad section of the first electrode 107 toward the second conductive section 124, and the second conductive section 124 protrudes from the pad section 109c of the second electrode 109 toward the first conductive section 122. The first conductive section 122 and the second conductive section 124 may be formed in the shortest route, for example, between the pad section of the first electrode 107 and the pad section 109c of the second electrode 109. If the first conductive section 122 is extended toward the second conductive section 124, the first conductive section 122 and the second conductive section 124 would become a continuous member in one piece (in other words, the connecting section 120 shown in FIGS. 1 and 2). It is noted that, if the second conductive section 124 is extended toward the first conductive section 122, the same result would be obtained.

The connecting section 120 may be composed of a material different from that of the first electrode 107 and the second electrode 109. For example, the connecting section 120 may preferably be composed of a material with a lower melting point than that of the first electrode 107 and the second electrode 109. By this, the connecting section 120 would readily be removed upon irradiation of laser to the connecting section 120. Concretely, for example, when gold (Au) is used as the material of the first electrode 107 and the second electrode 109, for example, aluminum (Al) may be used as the material of the connecting section 120. It is noted that the connecting section 120 may be composed of the same material as that of at least one of the first electrode 107 and the second electrode 109.

The connecting section 120 may be cut by removing a portion of the connecting section 120, as shown in FIG. 12 and FIG. 13. By this, damage to the first electrode 107 and the pad section 109c of the second electrode 109 which may be caused by laser irradiation can be avoided. It is noted that, for example, by irradiating a laser beam to the entire portion of the connecting section 120, the entire portion of the connecting section 120 can be removed, as shown in FIG. 14. In the invention, removing the entire portion of the connecting section 120 also means to be "cutting the connecting section 120."

It is noted that the step of cutting the connecting section 120 by a laser beam may be conducted after the step of sealing the optical device chip to be described below. In this case, the laser beam can be irradiated, through a transparent member 182 (see FIG. 15), to the connecting section 120.

According to another mode, the connecting section 120 may be cut, for example, by resistive heating through applying a voltage. In other words, the connecting section 120 is fused by heat generated upon circulating a current through the connecting section 120, whereby a portion of the connecting section 120 can be removed, as shown in FIG. 12 and FIG. 13. The voltage to be applied to the connecting section 120 may preferably be a reverse bias voltage with respect to the optical section 140.

For cutting the connecting section 120 by application of a voltage, the connecting section 120 may be formed in a manner to meet the following formulae (1)-(3).

$$\{IR_1/(R_1+R_2)\}^2 R_2 t \geqq mc(T_m-T_0) \quad (1)$$

$$R_2 < R_1 \quad (2)$$

$$R_2 = \rho L/(WD) \quad (3)$$

where $R_1$ is the resistance ($\Omega$) of the optical section 140, $R_2$ is the resistance ($\Omega$) of the connecting section 120, I is a current to be applied (A), t is the energizing time duration (seconds), m is the weight (g) of the connecting section 120, c is the specific heat (J/g·K) of the connecting section 120, $T_m$ is the melting point (° C.) of the connecting section 120, $T_0$ is the temperature (° C.) of the connecting section 120 before it is energized, $\rho$ is the specific resistance ($\Omega$·m) of the connecting section 120, L is the length (m) of the connecting section 120, W is the width (m) of the connecting section 120, and D is the thickness (m) of the connecting section 120.

The left side of the formula (1) expresses the calorific value caused by Joule heat, and the right side thereof expresses the calorific value that is required to elevate the temperature to the melting point ($T_m$). Also, the formula (2) expresses that the connecting section 120 can more readily circulate a current than the optical section 140 in order to prevent electrostatic destruction of the optical section 140. Also, the formula (3) is a formula to calculate the resistance value based on the configuration of the connecting section 120.

More concretely, for example, when aluminum (Al) is used to compose the connecting section 120, $T_m$=660 (° C.), c=0.899 (J/g·K), and $\rho$=2.4×10$^{-7}$ ($\Omega$·m). Also, when the optical device chip 100 is, for example, a surface emitting type semiconductor laser chip, $R_1$ is about 40($\Omega$). When the length L, the width W and the thickness D of the connecting section 120 are 20 μm, 5 μm and 1 μm, respectively, m=2.7×10$^{-10}$ (g) and $R_2$=0.96($\Omega$), which sufficiently meets the formula (2) above. When the application current I is 1 (mA), the connecting section 120 can be cut by setting the energizing time duration t to 0.16 seconds or more. It is noted that each of the electrodes 107 and 108 may be designed so as to sufficiently circulate a large current (for example, about 30 mA).

Also, the step of cutting the connecting section 120 may possibly be conducted after the step of sealing the optical device chip to be described below.

Also, in accordance with another embodiment, the connecting section 120 may be cut by, for example, etching. Upon completing the etching, the entire portion of the connecting section 120 may be removed, as shown in FIG. 14.

The connecting section 120 may be cut by, for example, wet etching. In this case, the entire structure including the optical device chip 100 and the supporting member may be dipped in an etching liquid to cut the connecting section 120. The connecting section 120 may be composed of a material different from the material of the first electrode 107 and the second electrode 109. For example, the connecting section 120 may preferably be composed of a material having a greater etching rate than that of the first electrode 107 and the second electrode 109. By this, when the connecting section 120 is dipped in an etching liquid, the connecting section 120 can be more readily removed. More concretely, for example, when gold (Au) is used to form the first electrode 107 and the second electrode 109, for example, aluminum (Al) may be used to form the connecting section 120, and, for example, phosphoric acid or hydrochloric acid may be used as the etching liquid. It is noted that the connecting section 120 can be cut by, for example, dry etching.

Figure 15:
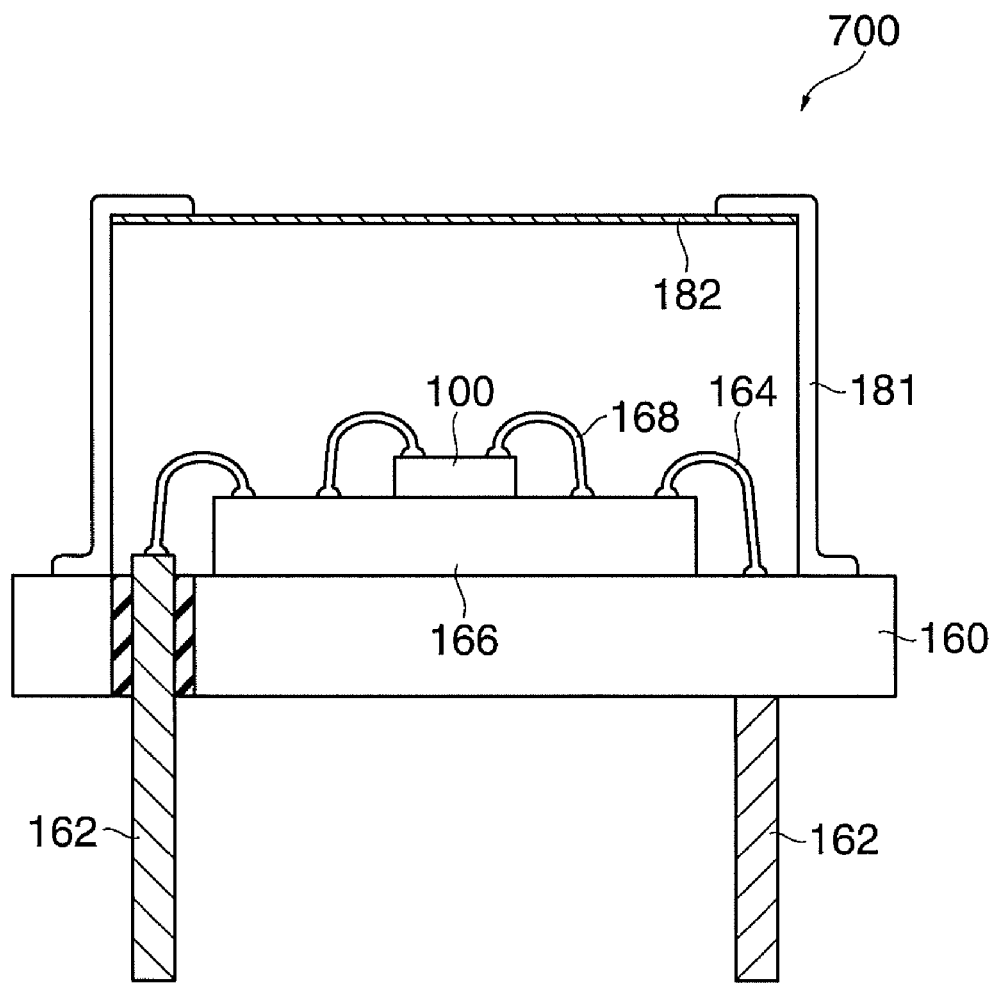
FIG. 15 is a schematic cross-sectional view showing the optical module in accordance with the embodiment.

(5) Next, as shown in FIG. 15, a sealing cap 181 equipped with a transparent member 182 such as a glass plate may be fused in, for example, an inert gas atmosphere, thereby sealing the optical device chip 100.

(6) By the steps described above, an optical module 700 in accordance with the present embodiment is obtained, as shown in FIG. 15. The optical module 700 may include the first supporting member 166, the second supporting member 160, the lead pins 162 and the optical device chip 100.

5. In the optical device chip 100 in accordance with the present embodiment, even when a voltage that would cause electrostatic destruction of the optical section 140 is applied, the current flows to the connecting section 120 that short-circuits the both ends of the optical section 140, as shown in FIG. 3. By this, electrostatic destruction of the optical section 140 can be prevented during the mounting process, such that, in accordance with the present embodiment, the reliability of the optical device chip 100 and the optical module 700 can be improved.

Also, in accordance with the present embodiment, the connecting section 120 is cut before the optical module 700 is completed. By this, the optical section 140 in the completed optical module 700 can be normally operated, and electrostatic destruction of the optical section 140 can be prevented at least until the time when the connecting section 120 is cut.

Embodiments of the invention are described above in detail. However, a person having an ordinary skill in the art should readily understand that many modifications can be made without departing in substance from the novel matter and effect of the invention. Accordingly, those modified examples are also included in the scope of the invention.

For example, when an epitaxial lift-off (ELO) method is used, the substrate 101 of the optical device chip 100 can be separated. In other words, the optical device chip 100 may be provided without the substrate 101.

What is claimed is:

1. An optical module comprising:
   a supporting member; and
   an optical device chip mounted on the supporting member, wherein the optical device chip includes: a first semiconductor layer of a first conductivity type; an optical layer that emits light or receives light formed above the first semiconductor layer; a second semiconductor layer of a second conductivity type formed above the optical layer; a first electrode electrically connected to the first semiconductor layer; a second electrode electrically connected to the second semiconductor layer; a first conductive section protruding from a pad section of the first electrode; and a second conductive section protruding from a pad section of the second electrode, wherein the first conductive section and the second conductive section are composed of a material different from a material of the first electrode and the second electrode, the first conductive section protrudes toward the second conductive section, and the second conductive section protrudes toward the first conductive section.

* * * * *